(12) United States Patent
Zhi et al.

(10) Patent No.: US 11,983,439 B2
(45) Date of Patent: May 14, 2024

(54) THREE-DIMENSIONAL MEMORY DEVICE AND METHOD FOR ENHANCED PAGE REGISTER RESET

(71) Applicant: YANGTZE MEMORY TECHNOLOGIES, INC., Santa Clara, CA (US)

(72) Inventors: Xiang Ming Zhi, San Jose, CA (US); Augustus Tsai, San Jose, CA (US)

(73) Assignee: YANGTZE MEMORY TECHNOLOGIES, INC., Santa Clara, CA (US)

( * ) Notice: Subject to any disclaimer, the term of this patent is extended or adjusted under 35 U.S.C. 154(b) by 9 days.

(21) Appl. No.: 17/450,642

(22) Filed: Oct. 12, 2021

(65) Prior Publication Data
US 2022/0317930 A1    Oct. 6, 2022

Related U.S. Application Data

(63) Continuation of application No. PCT/CN2021/083983, filed on Mar. 30, 2021.

(51) Int. Cl.
G06F 12/00    (2006.01)
G06F 3/06     (2006.01)

(52) U.S. Cl.
CPC .......... G06F 3/0659 (2013.01); G06F 3/0604 (2013.01); G06F 3/0679 (2013.01)

(58) Field of Classification Search
CPC .... G06F 3/0659; G06F 3/0604; G06F 3/0679; G06F 12/0246; G06F 12/0891; G06F 12/10; G06F 2212/7201; G06F 2212/7203; G06F 2212/7207; G11C 11/161; G11C 11/406; G11C 11/4063
See application file for complete search history.

(56) References Cited

U.S. PATENT DOCUMENTS

| | | |
|---|---|---|
| 2009/0300311 A1 | 12/2009 | Lee |
| 2011/0102636 A1 | 5/2011 | Kamphenkel et al. |
| 2012/0250431 A1* | 10/2012 | Cho .................. G11C 7/20 365/189.011 |
| 2018/0032271 A1 | 2/2018 | Seo et al. |
| 2019/0006013 A1 | 1/2019 | Lee |
| 2020/0135758 A1* | 4/2020 | Park .................. G11C 16/26 |
| 2020/0319953 A1 | 10/2020 | Kim et al. |

OTHER PUBLICATIONS

The World Intellectual Property Organization (WIPO) International Search Report for PCT/CN2021/083983 dated Jan. 6, 2022 4 pages.

* cited by examiner

Primary Examiner — Shawn X Gu
(74) Attorney, Agent, or Firm — Anova Law Group, PLLC

(57) ABSTRACT

A program method of a memory device having planes includes receiving a program command, obtaining an address associated with the program command, determining a first plane of the planes according to the address, and resetting a page register of the first plane without resetting one or more page registers of one or more remaining planes of the planes.

16 Claims, 12 Drawing Sheets

THREE-DIMENSIONAL MEMORY DEVICE AND METHOD FOR ENHANCED PAGE REGISTER RESET

CROSS-REFERENCE TO RELATED APPLICATION

This application claims the priority to PCT Patent Application No. PCT/CN2021/083983 filed on Mar. 30, 2021, the entire content of which is incorporated herein by reference.

FIELD OF THE TECHNOLOGY

This application relates to the field of semiconductor technology and, specifically, to a three-dimensional (3D) memory device and method of page register reset.

BACKGROUND OF THE DISCLOSURE

Not-AND (NAND) memory is a non-volatile type of memory that does not require power to retain stored data. The growing demands of consumer electronics, cloud computing, and big data bring about a constant need of NAND memories of larger capacity and better performance. As conventional two-dimensional (2D) NAND memory approaches its physical limits, three-dimensional (3D) NAND memory is now playing an important role. 3D NAND memory uses multiple stack layers on a single die to achieve higher density, higher capacity, faster performance, lower power consumption, and better cost efficiency.

Before data is written to a 3D NAND memory device, multiple page registers are reset or cleared. The register reset process can cause increase of the peak power, the total power, and the power noise. The disclosed methods are directed to solve one or more problems set forth above and other problems.

SUMMARY

In one aspect of the present disclosure, a program method of a memory device having planes includes receiving a program command for the memory device, obtaining an address associated with the program command, determining a first plane of the planes according to the address, and resetting a page register of the first plane without resetting one or more page registers of one or more remaining planes of the planes.

In another aspect of the present disclosure, a memory device includes one or more logical units (LUNs) including planes, page registers corresponding to the planes, respectively, and a controller for executing commands. The controller is configured to receive a program command for the memory device, obtain an address associated with the program command, determine a first plane of the planes according to the address, and reset one of the page registers corresponding to the first plane without resetting one or more remaining page registers of the page registers.

In another aspect of the present disclosure, a method of a memory device having planes includes receiving a program command for the memory device, obtaining an address associated with the program command, determining a first plane of the planes according to the address for register reset, and maintaining status of one or more page registers of one or more remaining planes of the planes.

In another aspect of the present disclosure, a memory device includes planes and a reset circuit for resetting the planes. The reset circuit is configured to obtain a first control signal based on an address for reset of the planes, and reset a page register of a first plane of the planes according to the first control signal without resetting one or more page registers of one or more remaining planes of the planes.

Other aspects of the present disclosure can be understood by those skilled in the art in light of the description, the claims, and the drawings of the present disclosure.

DETAILED DESCRIPTION

The following describes the technical solutions in the embodiments of the present disclosure with reference to the accompanying drawings. Wherever possible, the same reference numbers will be used throughout the drawings to refer to the same or like parts. Apparently, the described embodiments are merely some but not all of the embodiments of the present disclosure. Features in various embodiments may be exchanged and/or combined. Other embodiments obtained by a person skilled in the art based on the embodiments of the present disclosure without creative efforts shall fall within the scope of the present disclosure.

Figure 1:
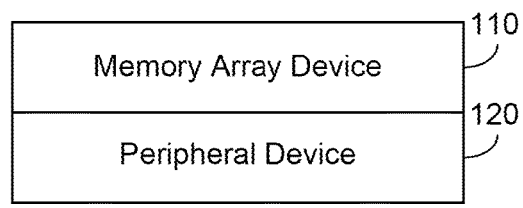
FIG. 1 illustrates a cross-sectional view of an exemplary three-dimensional (3D) memory device according to various embodiments of the present disclosure.

FIG. 1 schematically shows a cross-sectional view of an exemplary 3D memory device 100 according to embodiments of the present disclosure. The 3D memory device 100 may be a discrete memory device working individually. The 3D memory device 100 may also be a part of a memory system that has multiple memory devices 100. In some embodiments, the 3D memory device 100 may be coupled to or embedded in a host device (not shown). In such cases, the 3D memory device 100 may be controlled by a controller of the host device. Host devices may include a computing device or electronic device such as a mobile phone, a smart phone, a smart watch, a tablet computer, a laptop computer, a personal computer, a data server, and a workstation, among other host devices.

Optionally, the 3D memory device 100 may include a memory array device 110 and a peripheral device 120. The memory array device 110 may include memory cells that form one or more 3D arrays. The peripheral device 120 may include a circuitry as a controller to control operations of the 3D memory device 100. In some embodiments, the memory array device 110 and the peripheral device 120 may be fabricated separately and then bonded together to form a stack-like structure, as shown in FIG. 1. Alternatively, the memory array device 110 and the peripheral device 120 may be integrated into one device. For example, the peripheral device 120 may be fabricated first and then the memory array device 110 may be made over the peripheral device 120 and using the peripheral device 120 as a substrate. In some other embodiments, the memory array device 110 and the peripheral device 120 may be fabricated separated and then mounted side by side on a printed circuit board (PCB).

Figure 2:
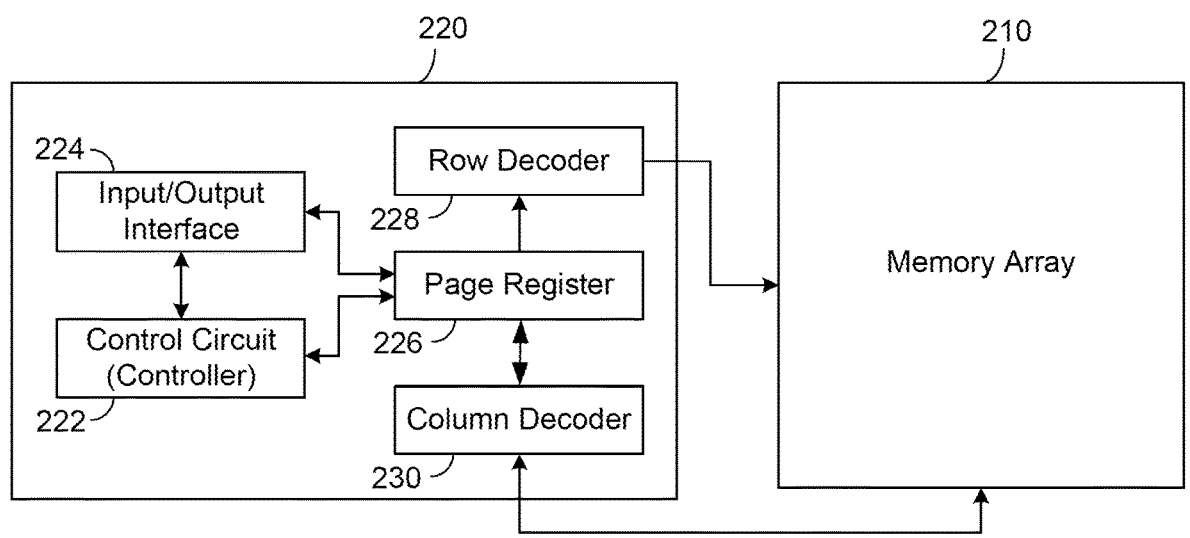
FIG. 2 illustrates a block diagram of a 3D memory device according to various embodiments of the present disclosure.

FIG. 2 shows a block diagram of a 3D memory device 200 according to embodiments of the present disclosure. The 3D memory device 200 may include a memory array 210 and a circuitry 220. The memory array 210 may include a 3D array of memory cells (not shown). The circuitry 220 may contain a control circuit 222, an input/output (I/O) interface 224, a page register 226, a row decoder 228, and a column decoder 230. The row decoder and column decoder may also be referred to as X-decoder and Y-decoder, respectively. Further, the circuitry 220 may include a Y-path circuit (not shown). The Y-path circuit is connected to the column decoder 230 (i.e., the Y-decoder) and arranged to allocate a bit line path according to an output transmitted from the column decoder 230. The control circuit 222 may work as a controller that implements various functions of the 3D memory device 200. For example, the control circuit 222 may implement read operations, write operations, and erase operations. The I/O interface 224 may contain an I/O circuit to receive input of command signals, address signals, and data signals to the 3D memory device 200 and transmit data signals and status information from the 3D memory device 200 to an external device (e.g., a host device). The row decoder 228 may select one or more word lines and the column decoder 230 may select one or more bit lines of the memory array 210. The row decoder 228 and column decoder 230 may also receive different voltages from a voltage generator circuit (not shown) and transfer the received voltages to the selected one or more word lines and the selected one or more bit lines. The page register 226 may include one or more page registers and temporarily store incoming or outgoing data when the data is transferred between the I/O interface 224 and the memory array 210 at write or read operations. Optionally, the page register 226 may contain certain sensing devices or sense amplifiers (not shown) to sense a data state of a memory cell of the memory array 210. For example, the data state of a memory cell may be detected by sensing a state of a bit line connected to the memory cell. The term "connected" as used herein indicates electrically connected. The verb "connect" as used herein indicates electrically connecting.

A 3D NAND memory device may logically include one or more NAND targets. A NAND target may contain one or more logical units (LUNs). A LUN may contain one or more planes. A plane may contain one or more blocks. A block may contain multiple pages. A page, containing a number of bytes or words, is the smallest addressable unit for read and write operations. A LUN may be the minimum unit that can execute commands and report status independently. NAND memory cells in a block can be reset together at a block erase operation.

One or more page registers (also referred to as page buffers) may be configured for and connected to each plane. Data transferred to or from a page may be temporarily stored in a page register. For example, a page register may store a portion of data while writing another portion of the data to a page. In some cases, when a write operation, which is also referred to as a program operation, is performed at a NAND target, page registers of planes of all LUNs of the NAND target are cleared or reset. In some other cases, when a write operation is performed at a NAND target, page registers of all planes of selected LUNs of the target are reset. In above cases, page registers of planes where the page data remains unchanged are reset, which increases the number of registers that go through a reset process. Consequently, the peak power, total power, and power noise may be increased unnecessarily at write operations.

Figure 3:
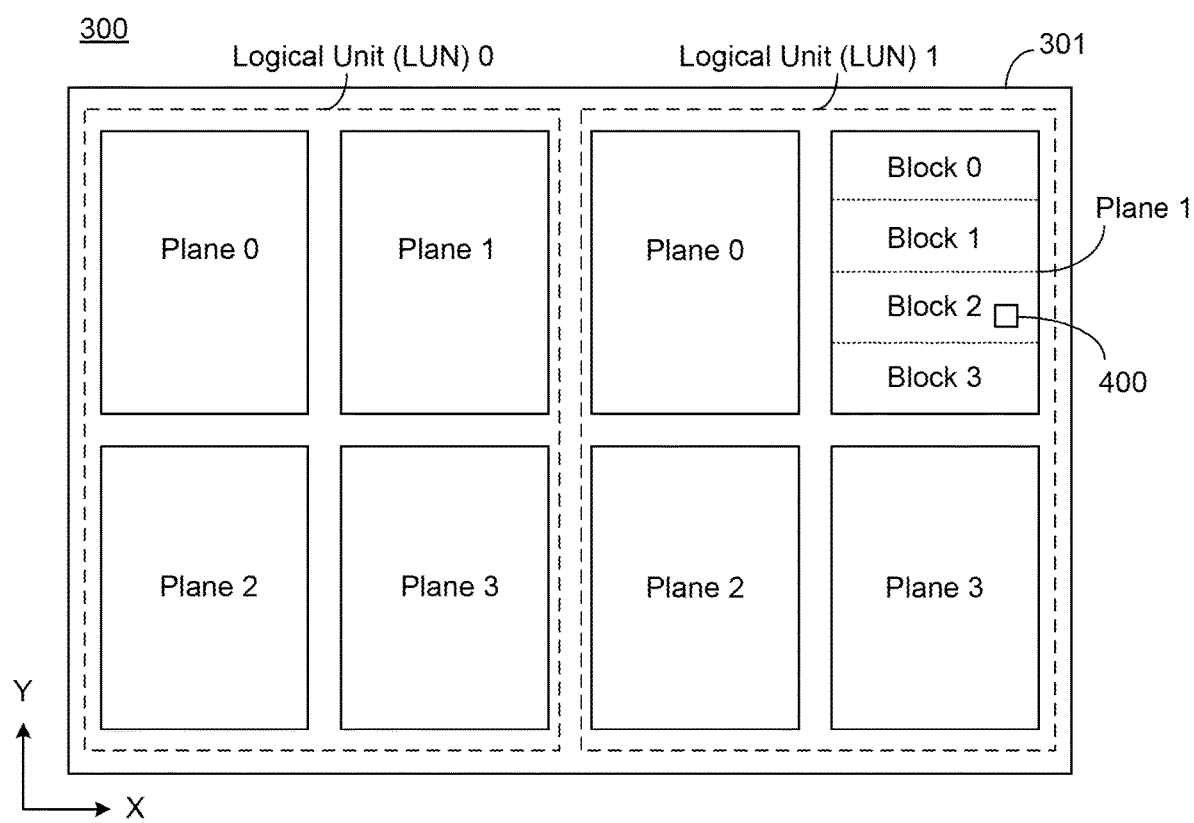
FIG. 3 illustrates a top view of configuration of a 3D array device according to various embodiments of the present disclosure.

FIG. 3 shows schematically a top view of a configuration of a 3D array device 300 according to various embodiments of the present disclosure. The top view is taken over a 3D memory die 301 of the 3D array device 300 in an X-Y plane. The 3D memory die 301 may be divided into planes. Four planes, for example, may form a LUN. One or more LUNs may form a NAND target of the 3D array device 300. As an example, the 3D array device 300 may include one NAND target that contains two LUNs such as LUN 0 and LUN 1. Referring to FIG. 3, each LUN may have, for example, plane 0-plane 3, and each plane may be further divided into blocks such as block 0-block 3. In addition, each block may contain pages (not shown) where NAND memory cells are arranged. The numbers of the targets, LUNs, planes, and blocks as depicted above are exemplary and for description purposes. Other numbers of the targets, LUNs, planes, and blocks, larger or smaller than those depicted above, may be used for the disclosed 3D array device 300 according to various embodiments of the present disclosure.

Figure 4:
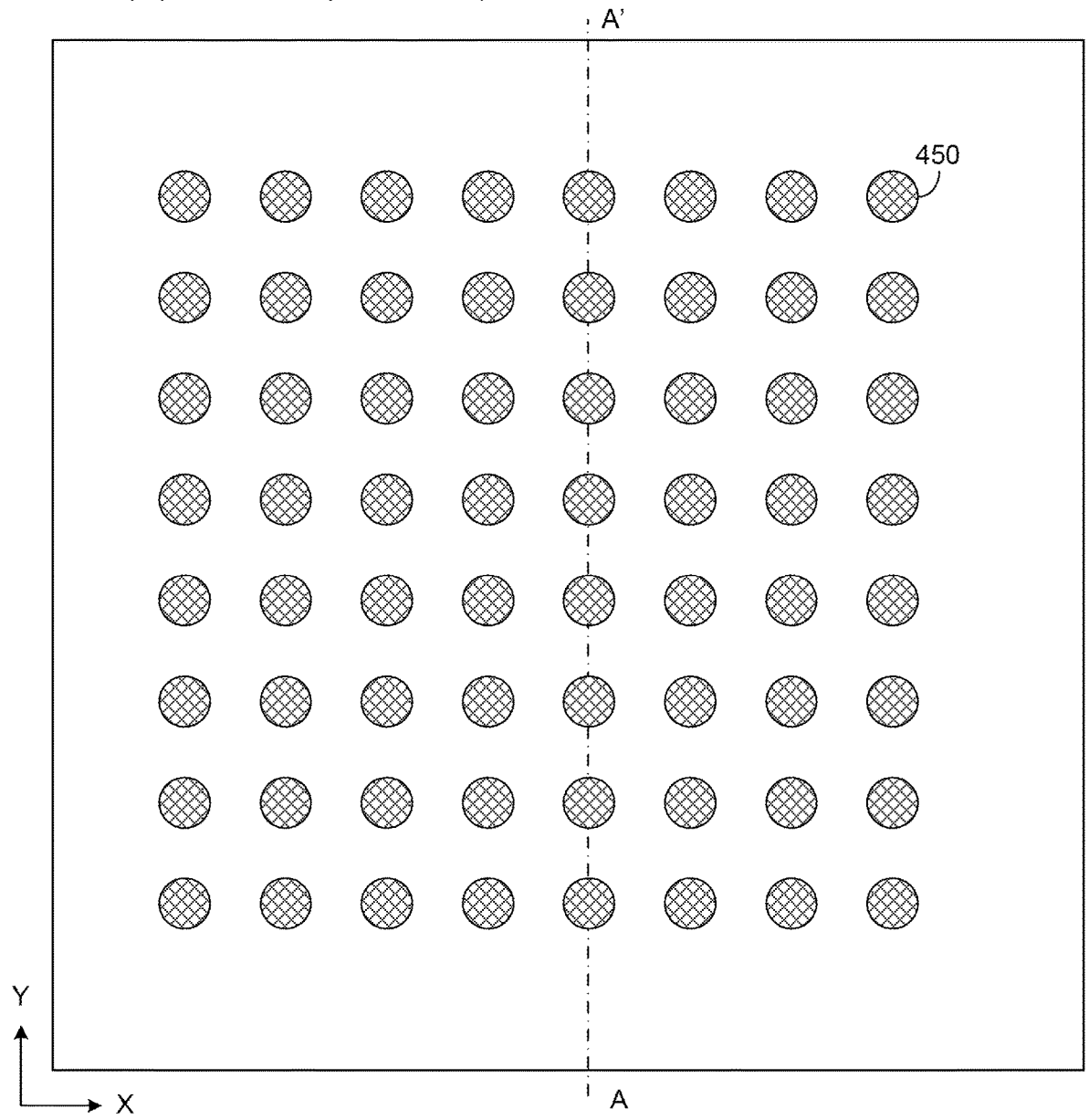
FIGS. 4 and 5 illustrate a top view and a cross-sectional view of a portion of the 3D array device shown in FIG. 3 at a certain stage in an exemplary fabrication process according to various embodiments of the present disclosure.
Figure 5:
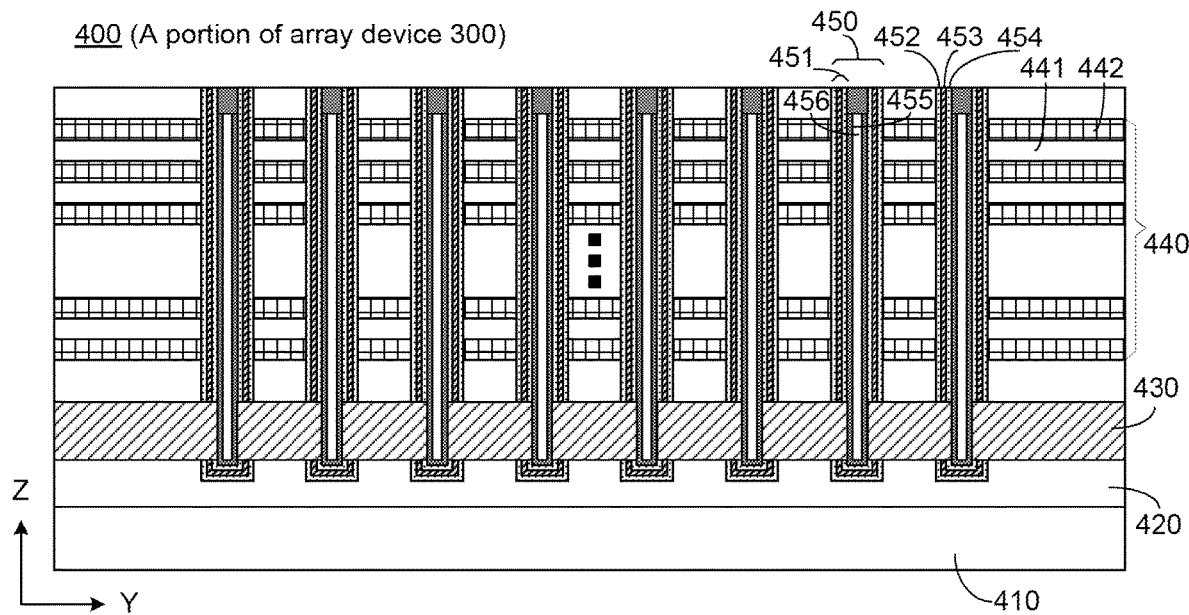

FIGS. 4 and 5 show a schematic top view and a schematic cross-sectional view of a portion 400 of the 3D array device 300 at a certain stage in an exemplary fabrication process according to embodiments of the present disclosure. Referring to FIG. 3, the portion 400 may represent a part of the block 2 of the plane 1 of the LUN 1. As shown in FIG. 4, the top view is in an X-Y plane and the cross-sectional view is in a Y-Z plane. The cross-sectional view shown in FIG. 5 is taken along a line AA' of FIG. 4. As shown in FIG. 5, the portion 400 or the 3D array device 300 may include a substrate 410, a doped region 420, and a semiconductor layer 430. The substrate 410 may include a semiconductor material, such as single crystalline silicon. In some embodiments, a top portion of the substrate 410 may be doped by n-type dopants via ion implantation and/or diffusion to form the doped region 420. The semiconductor layer 430 may be formed over the doped region 410 and may contain, e.g., n-doped polycrystalline silicon (polysilicon). Over the semiconductor layer 430, a layer stack 440 may be fabricated. The layer stack 440 may include dielectric layers 441 and conductor layers 442, stacked alternately over each other. The dielectric layer 441 may contain a dielectric material (e.g., silicon oxide) and the conductor layer 442 may contain a conductive material (e.g., tungsten (W)). The term "conductive", as used herein, indicates electrically conductive. The layer stack may include 64 pairs, 128 pairs, or more than 128 pairs of the dielectric layer 441 and conductor layer 442.

Referring to FIGS. 4 and 5, channel holes 450 are arranged to extend in the Z direction and form an array of a predetermined pattern in an X-Y plane. The channel holes 450 may have a cylinder shape or pillar shape that extends through the layer stack 440, the semiconductor layer 430, and partially penetrates the doped region 420. The quantity, dimension, and arrangement of the channel holes 450 shown in FIGS. 4 and 5 and in other figures in the present disclosure are exemplary and for description purposes, although any suitable quantity, dimension, and arrangement may be used for the disclosed 3D array device 300 according to various embodiments of the present disclosure.

Inside a channel hole 450, a functional layer 451 may be deposited. The functional layer 451 may include a blocking layer 452 on the sidewall and bottom of the channel hole to block an outflow of charges, a charge trap layer 453 on a surface of the blocking layer 452 to store charges during an operation of the 3D array device 300, and a tunnel insulation layer 454 on a surface of the charge trap layer 453. In some embodiments, the functional layer 451 may have an oxide-nitride-oxide (ONO) structure. That is, the blocking layer 452 may be a silicon oxide layer deposited on the sidewall of the channel hole 450, the charge trap layer 453 may be a silicon nitride layer deposited on the blocking layer 452, and the tunnel insulation layer 454 may be another silicon oxide layer deposited on the charge trap layer 453.

Over the tunnel insulation layer 454, a channel layer 455 may be deposited. The channel layer 455 is also referred to as a "semiconductor channel" and may include polysilicon in some embodiments. Like the channel holes, the channel layer 455 also extends through the layer stack 440 and into the doped region 420. The semiconductor layer 430 may be formed on the doped region 420 and on certain sidewalls or side portions of the channel layers 455, and connected to the doped region 420 and the channel layers 455. In some embodiments, the semiconductor layer 430 may be used as an array common source. The channel hole 450 may be filled by an oxide material 456 after the channel layer 455 is formed. The functional layer 451 and channel layer 455 formed in a channel hole 450 may be considered as a channel structure.

As shown in FIG. 5, a portion of each functional layer 451 in a channel hole 450 may be between a portion of a conductor layer 442 and a portion of a channel layer 455. Each conductor layer 442 may connect NAND memory cells in an X-Y plane and be configured as a word line of the 3D array device 300. The channel layer 455 formed in a channel hole 450 may be configured to connect a string of NAND memory cells along the Z direction. One end of the channel layer 455 may be connected to a bit line of the 3D array device 300. As such, a portion of the functional layer 451 in a channel hole 450 in an X-Y plane, as a part of a NAND memory cell, may be arranged between a conductor layer 442 and a channel layer 455, i.e., between a word line and a channel layer connected to a bit line. A NAND memory cell, including a portion of a conductor layer 442 that is around a portion of a channel hole 450, may be considered as a field-effect transistor with a control gate, a source, and a drain. A portion of a conductor layer 442 that is around a portion of a channel hole 450 may function as the control gate for the transistor. The 3D array device 300 may be considered as including a 2D array of strings of NAND memory cells (such a string is also referred to as a "NAND string"). Each NAND string may contain multiple NAND memory cells and extend vertically toward the substrate 410. The NAND strings may form a 3D array of the NAND memory cells. A NAND string may correspond to a transistor string that contains multiple field-effect transistors connected in series along a channel layer 455 in the Z direction. As such, the transistor strings may form a 3D array of the field-effect transistors.

Figure 6:
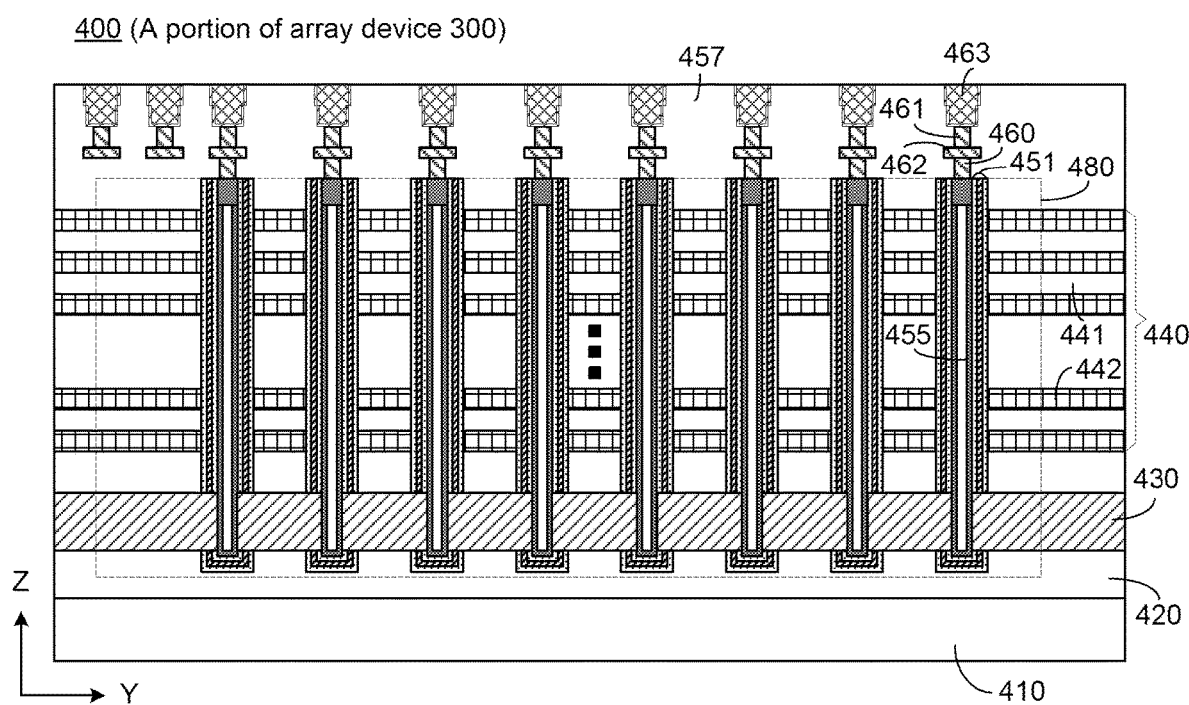
FIGS. 6 and 7 illustrate cross-sectional views of the portion of the 3D array device shown in FIGS. 4 and 5 at a certain stage in the exemplary fabrication process according to various embodiments of the present disclosure.
Figure 7:
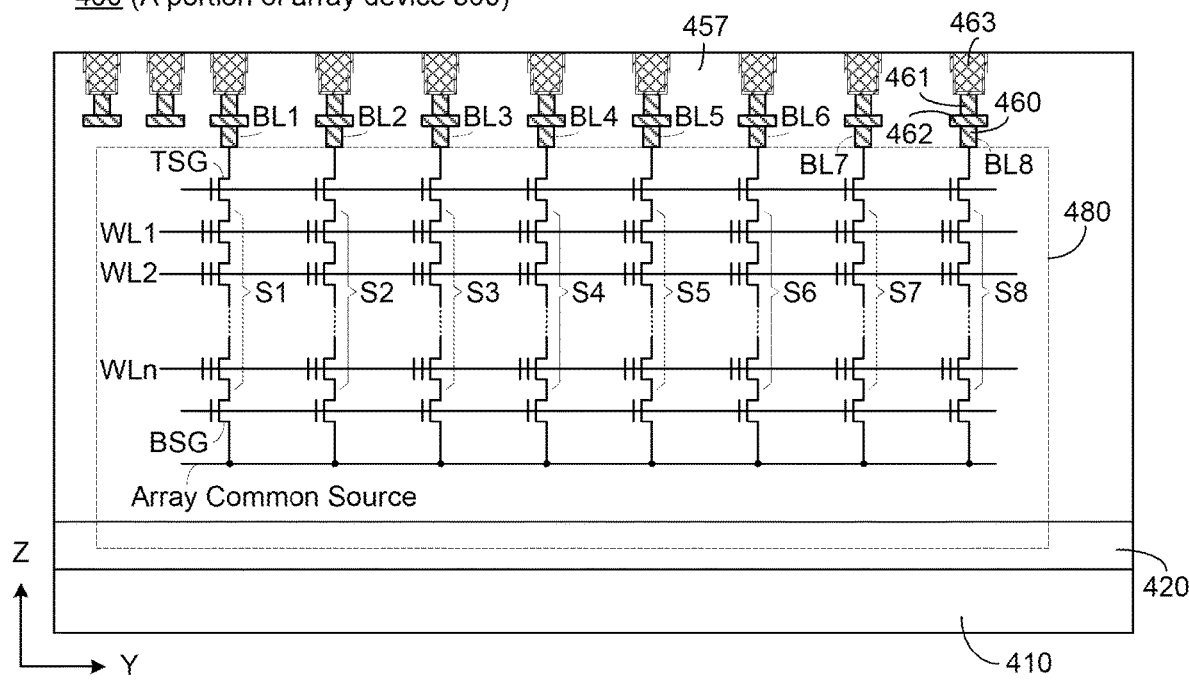

FIGS. 6 and 7 show schematic cross-sectional views of the portion 400 of the 3D array device 300 at a certain stage in the exemplary fabrication process according to embodiments of the present disclosure. As shown in FIG. 6, a dielectric layer 457 may be deposited over the layer stack 440 and the channel holes 450. Further, vias 460 and 461 and conductive layers 462 may be formed for interconnect in the dielectric layer 457. For example, some of the vias 460 may be connected to the channel layers 455. Thereafter, a dielectric material may be deposited to make the dielectric layer 457 thicker and connecting pads 463 may be formed over and connected to the vias 461. Some connecting pads 463 may be connected with the channel layers 455 through the vias 461-462 and the conductive layers 463. A conductive material (e.g., W) may be used to fabricate the vias 460-461, conductive layers 462, and connecting pads 463.

The channel structures and conductor layers 442 as shown in the cross-sectional view in FIG. 6 may represent a portion 480, which is in the same block as the portion 400, i.e., the block 2 of the plane 1 of the LUN 1 of the 3D array device 300. The portion 480, whose boundary is depicted by dashed lines in FIG. 6, may contain multiple NAND strings or transistor strings. The field-effect transistors and electrical circuit of the portion 480 are illustrated in FIG. 7 schematically, where a circuit diagram replaces the diagram of the channel structures and the layer stack 440. As shown in FIG. 7, each NAND memory cell is replaced by a field-effect transistor. The channel layers 455 are connected to bit lines BL1-BL8 (e.g., the vias 460), respectively. The field-effect transistor whose drain is connected to a bit line may be configured as a select transistor and referred to as a top select gate (TSG). The field-effect transistor whose source is connected to the array common source may also be configured as a select transistor and referred to as a bottom select gate (BSG). The control gates of the TSGs may be connected to a select line (e.g., a conductor layer 442), while the control gates of the BSGs may be connected to another select line (e.g., another conductor layer 442). The word lines WL1-WLn may correspond to conductor layers 442 between the TSGs and BSGs.

NAND memory cells (or field-effect transistors) whose control gates are connected to a conductor layer 442 (i.e., a word line) may form a page. As such, there may be n pages that are connected to word lines WL1-WLn, respectively. NAND memory cells (or field-effect transistors) connected to a channel layer 455 that is connected with a bit line may form a NAND string or transistor string. As shown in FIG. 7, transistor strings S1-S8 are connected to bit line BL1-BL8, respectively. In some embodiments, a page may be considered as a row, and a NAND string may be considered as a column. The address of NAND memory may include a row address and a column address. The row address indicates the page, block, and LUN to be accessed, while the column address indicates the byte or word within a page to access.

Figure 8:
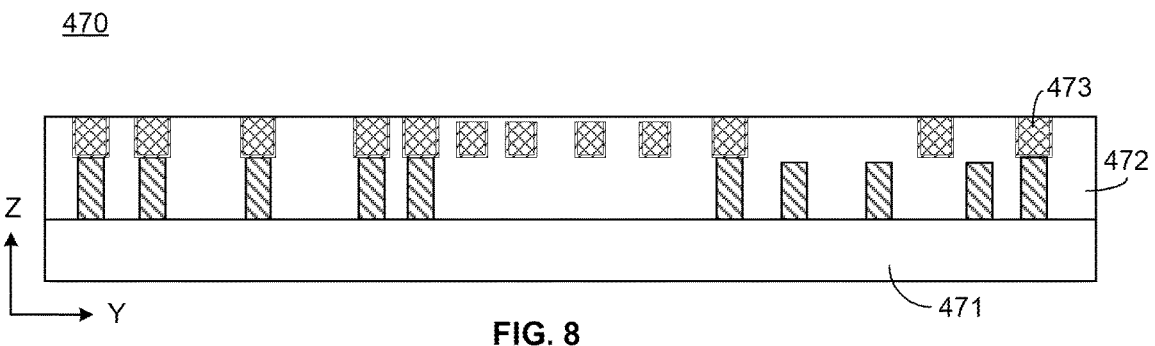
FIG. 8 illustrates a cross-sectional view of an exemplary peripheral device according to various embodiments of the present disclosure.

FIG. 8 shows a schematic cross-sectional view of a portion 470 of a peripheral device according to embodiments of the present disclosure. The peripheral device may include a semiconductor substrate 471 such as single crystalline silicon. A control circuitry (e.g., the control circuit 222 with reference to FIG. 2) may be fabricated on the substrate 471 and used for facilitating the operation of a 3D memory device. A dielectric layer 472 may be deposited over the substrate 471 and the control circuitry. Connecting pads such as connecting pads 473 and vias may be formed in the dielectric layer 472. The connecting pads 473 may be configured for connection with the 3D array device 300 and contain a conductive material such as W.

Figure 9:
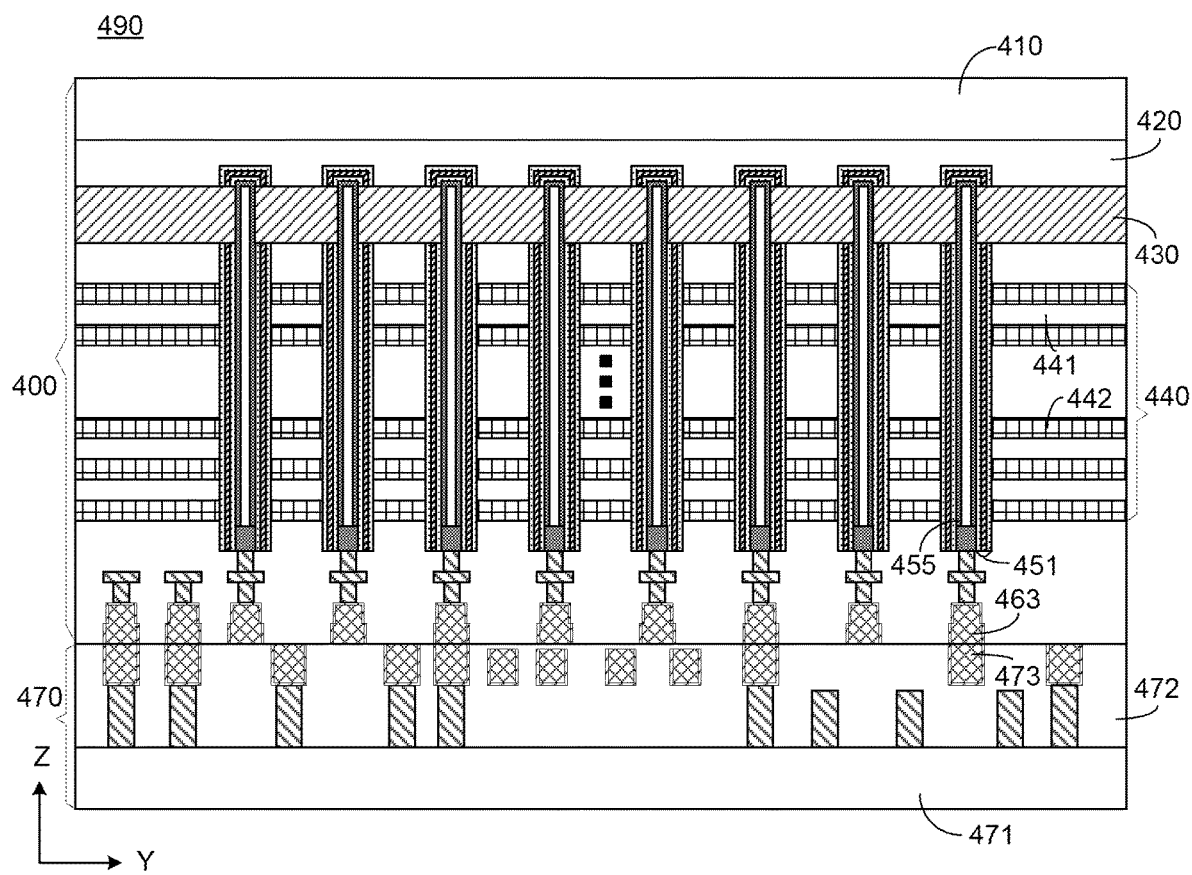
FIG. 9 illustrates a cross-sectional view of an exemplary 3D memory device after the 3D array device shown in FIG. 6 is bonded with the peripheral device shown in FIG. 7 according to various embodiments of the present disclosure.

FIG. 9 schematically shows a portion 490 of an exemplary 3D memory device at a certain fabrication stage according to embodiments of the present disclosure. The 3D memory device may include the 3D array device 300 shown partially in FIG. 6 and the peripheral device shown partially in FIG. 8. The peripheral device is configured to control the array device 300 or the 3D memory device.

The 3D array device 300 and the peripheral device may be bonded by a flip-chip bonding method to form the 3D memory device, as shown schematically in FIG. 9. For the 3D array device 300 and the peripheral device, the bottom side of the substrate 410 or 471 may be referred to as the back side, and the side with the connecting pads 463 or 473 may be referred to as the front side or face side. After the flip-chip bonding process, the connecting pads 463 are bonded with the connecting pads 473, respectively. That is, the 3D array device 300 and peripheral device are bonded face to face and in electrical communication.

Thereafter, other fabrication steps or processes may be performed to complete fabrication of the 3D memory device. Details of the other fabrication steps or processes are omitted for simplicity.

Figure 10:
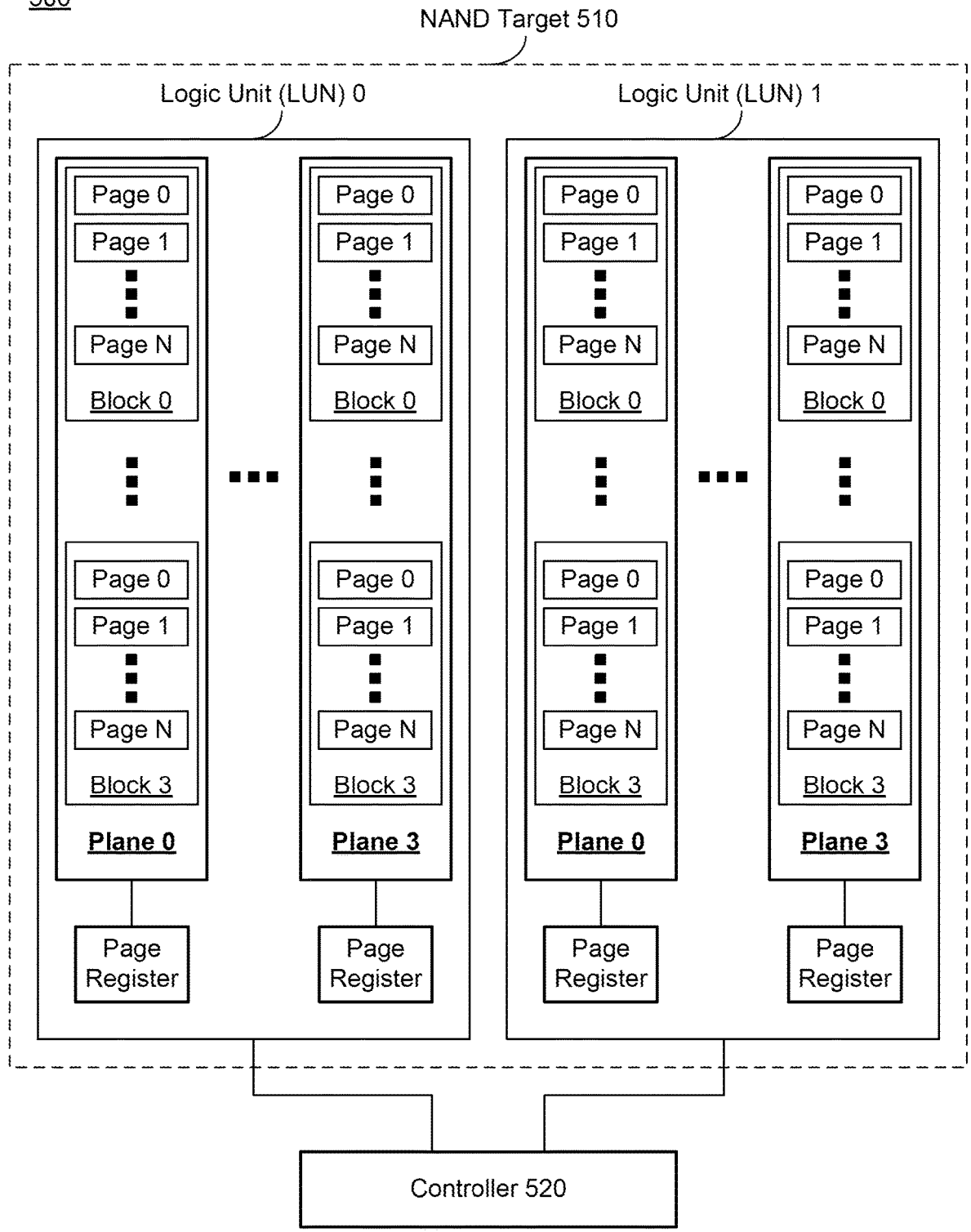
FIG. 10 illustrates an organization diagram of the 3D memory device shown in FIG. 9 according to various embodiments of the present disclosure.

FIG. 10 depicts a schematic organization diagram 500 of the 3D memory device that is partially shown in FIGS. 3-9 according to various embodiments of the present disclosure. As illustrated above, the 3D memory device may exemplarily have a NAND target (e.g., a NAND target 510) that contains LUN 0 and LUN 1. The LUNs may be connected to a controller 520 that may, for example, have similar functions to that of the control circuit 222 with reference to FIG. 2. Each LUN may exemplarily contain four planes, e.g., plane 0-plane 3. Each plane may exemplarily contain four blocks, e.g., block 0-block 3. Each block may exemplarily contain a number of pages. Further, as shown in FIG. 10, page registers may be connected to the planes of the LUN 0 and LUN 1, respectively. In some embodiments, one page register is connected to one plane. Optionally, more than one page register may be connected to a plane of the LUN 0 and LUN 1 in some cases. When a page register is assigned and connected to a plane, it may be considered that the page register works for the plane, and the plane includes the page register.

In some embodiments, certain write operations may be represented by a page program operation and a write command may be replaced by a page program command. For example, a page program operation may be arranged to program data to a memory array and the memory array may be programmed by page. Optionally, partial page programming may also be implemented. After a page program command is received by the controller 520, there may be two scenarios. In the first scenario, after the controller 520 receives a page program command for the NAND target 510, page registers of all LUNs of the NAND target are reset or cleared by the controller 520. Referring to FIG. 10, page registers of all LUNs of the NAND target 510 indicate all the page registers of the plane 0-plane 3 of the LUN 0 and LUN 1. Thus, all page registers of the plane 0-plane 3 of the LUN 0 and LUN 1 are reset after the page program command is obtained in the first scenario. In the second scenario, after the controller 520 receives a page program command for the NAND target 510, all page registers of a selected LUN of the NAND target 510 are cleared. Referring to FIG. 10, page registers of a selected LUN of the NAND target 510 indicate all page registers of the plane 0-plane 3 of either LUN 0 or LUN 1. For example, if the LUN 0 is selected, all page registers of the plane 0-plane 3 of the LUN 0 are reset by the controller 520 after the page program command is obtained in the second scenario. If the LUN 1 is selected, all page registers of the plane 0-plane 3 of the LUN 1 are reset by the controller after the page program command is obtained in the second scenario.

In many cases, however, not all planes of a LUN need to be re-programmed and some planes may keep the stored data unchanged at a page program operation. Take LUN 0 in FIG. 10 for example. A page program command may require a page program action (i.e., write actions) for one, two, three, but not four planes. As such, not all page registers of the plane 0-plane 3 need to be reset when less than four planes need a page program action. Resetting all planes of all LUNs (e.g., the first scenario) or all planes of one LUN (e.g., the second scenario) increase the number of page registers that are cleared by the controller 520, and thus can increase the peak power, total power, and power noise of the 3D memory device during a page reset process.

Figure 11:
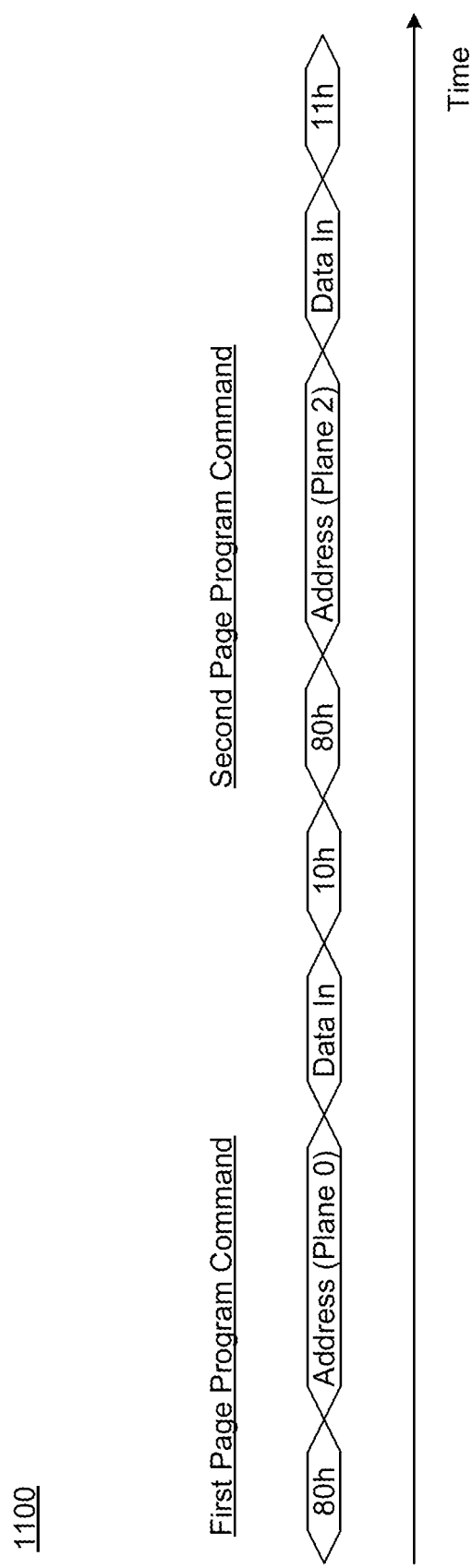
FIG. 11 illustrates a time diagram for write operations of the 3D memory device shown in FIG. 10 according to various embodiments of the present disclosure.

FIG. 11 shows a schematic timing diagram 1100 for page program operations of the 3D memory device shown in FIG. 10 according to various embodiments of the present disclosure. The timing diagram 1100 schematically presents commands and instructions along a timeline. When a single plane is involved, 80$h$ may represent the first cycle of a page program command, while 10$h$ may represent the second cycle of the page program command. When multiple planes are involved, 80$h$ may represent the first cycle of a multi-plane page program command, while 11$h$ may represent the second cycle of the multi-plane page program command. In some embodiments of a multi-plane page program operation, two (or more) pages of different planes may have the same address and may be programmed in parallel (e.g., concurrently or within the same time period). Optionally, two (or more) pages of different planes may also be reset in parallel (e.g., concurrently or within the same time period). The planes at a multi-plane page program operation may be from a same LUN. Alternatively, the planes at a multi-plane page program operation may be from different LUNs.

As shown in FIG. 11, after the controller 520 receives a first page program command, it may check the address, e.g., a 6-byte address and perform the first cycle 80$h$. A plane indicated in the address, e.g., the plane 0, may be determined by the controller 520. Then, the controller 520 may only reset the page register of the plane that is indicated in the address. If the plane indicated in the address has a single page register, only the single page register is reset. If the plane indicated in the address has multiple page registers, only the multiple page registers are reset. As such, the controller 520 does not reset page registers of other planes of the NAND target 510 and may keep the page registers of the other planes of the NAND target 510 unchanged. Further, a data input command may be performed by the controller 520 to obtain data signals for the page program operation followed by executing the second cycle of the page program command (e.g., command 10$h$). Thereafter, the controller 520 may receive a second page program command that is a multi-plane page program. The multi-plane page program is about writing to multiple planes, while the multiple planes may be from LUN 0 and/or LUN 1 in various embodiments. The controller 520 may check the address, e.g., a 6-byte address and perform the first cycle of the multi-plane page program command 80*h*. Planes indicated in the address, e.g., the plane 2, may be determined by the controller 520. Then, the controller 520 may only reset page registers of the planes (e.g., planes 2 from LUN 0 and LUN 1) that are indicated in the address. Thus, the controller 520 does not reset page registers of other planes of the NAND target 510 that are not indicated in the address and may keep the page registers of the other planes of the NAND target 510 unchanged. Further, another data input command is performed to obtain data signals for the multi-plane page program operation and the second cycle of the page program command (e.g., command 11*h*) is executed by the controller 520. Hence, only the page register or page registers of the plane or planes that are indicated in a page program command are reset. Compared to clearing all page registers of all LUNs or clearing all page registers of selected LUNs, the peak power and the total power during a page register resetting process may be reduced. In addition, the power noise of the 3D memory device may be improved.

Figure 12:
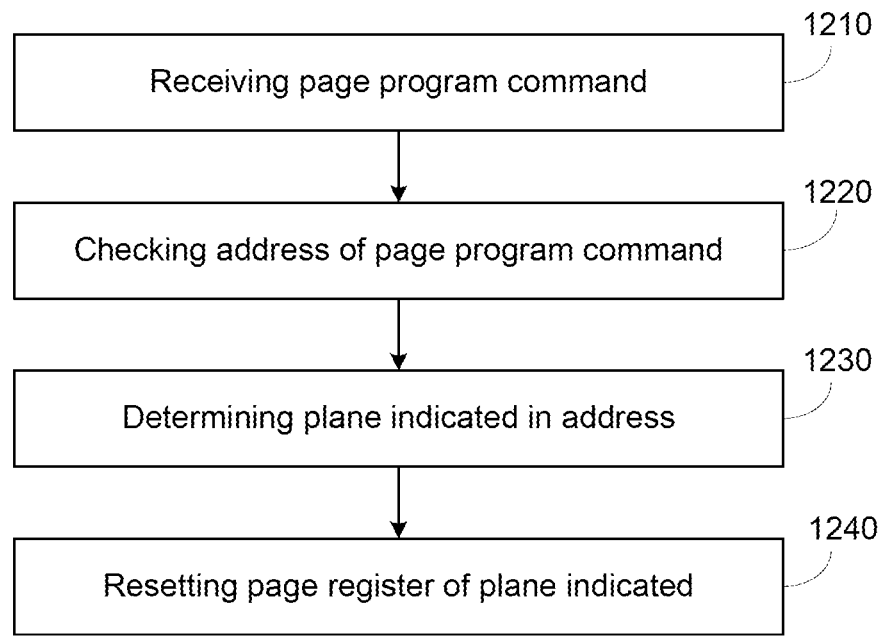
FIG. 12 illustrates a schematic flow chart showing methods of performing page register reset at a 3D memory device according to various aspects of the present disclosure.

FIG. 12 shows a schematic flow chart 1200 for performing a page program operation at a 3D memory device according to embodiments of the present disclosure. Assuming that the 3D memory device has one or more NAND targets and each NAND target contains one or more planes. Each plane contains blocks that have pages of NAND memory cells. Each plane also includes one or more page registers.

At 1210, a controller of the 3D memory device receives a page program command for a page program operation at a NAND target and starts checking or examining the page program command. The page program command may be a command set including multiple commands and communication items. At 1220, the controller detects and obtains an address from the page program command. The address may be, e.g., a six-byte address that provides a location for the page program operation. The controller checks or examines the address after obtaining it. At 1230, the controller identifies or determines a plane that is indicated in the address or according to the address. The indicated plane represents a location where page programming is to be implemented.

At 1240, the page register of the plane indicated in the address is cleared in resetting by the controller. If the plane indicated in the address has multiple page registers, the multiple page registers may be reset. If the NAND target has a single LUN, the page register (or page registers) or only the page register (or page registers) of the plane indicated in the address is cleared, while page registers of other planes (or remaining planes) of the single LUN are not cleared and remain unchanged. That is, the controller maintains the status of page registers of other planes of the single LUN (or the NAND target) that are not indicated in the address. If the NAND target has multiple LUNs, the page register (or page registers) or only the page register (or page registers) of the plane indicated in the address is cleared, while page registers of other planes (or remaining planes) of the multiple LUNs (or the NAND target) are not cleared and remain unchanged. That is, the controller maintains the status of page registers of other planes of the NAND target that are not indicated in the address.

If the controller receives a multi-plane page program command for a multi-plane page program operation at 1210, it first checks or examines the multi-plane page program command. At 1220, the controller detects and obtains an address from the multi-plane page program command. Then, the controller checks or examines the address. At 1230, the controller identifies or determines planes that are indicated in the address. The indicated planes represent locations where multi-plane page programming is to be implemented.

At 1240, the page registers of the planes indicated in the address are cleared in resetting by the controller. If the NAND target has a single LUN, the page registers or only the page registers of the planes indicated in the address are cleared, while page registers of other planes of the single LUN (or other planes of the NAND target) are not cleared and remain unchanged. That is, the controller maintains the status of page registers of other planes of the NAND target that are not indicated in the address. If the NAND target has multiple LUNs, the page registers or only the page registers of the planes indicated in the address are cleared, while page registers of other planes of the multiple LUNs (or other planes of the NAND target) are not cleared and remain unchanged. That is, the controller maintains the status of page registers of other planes of the NAND target that are not indicated in the address.

Figure 13A:
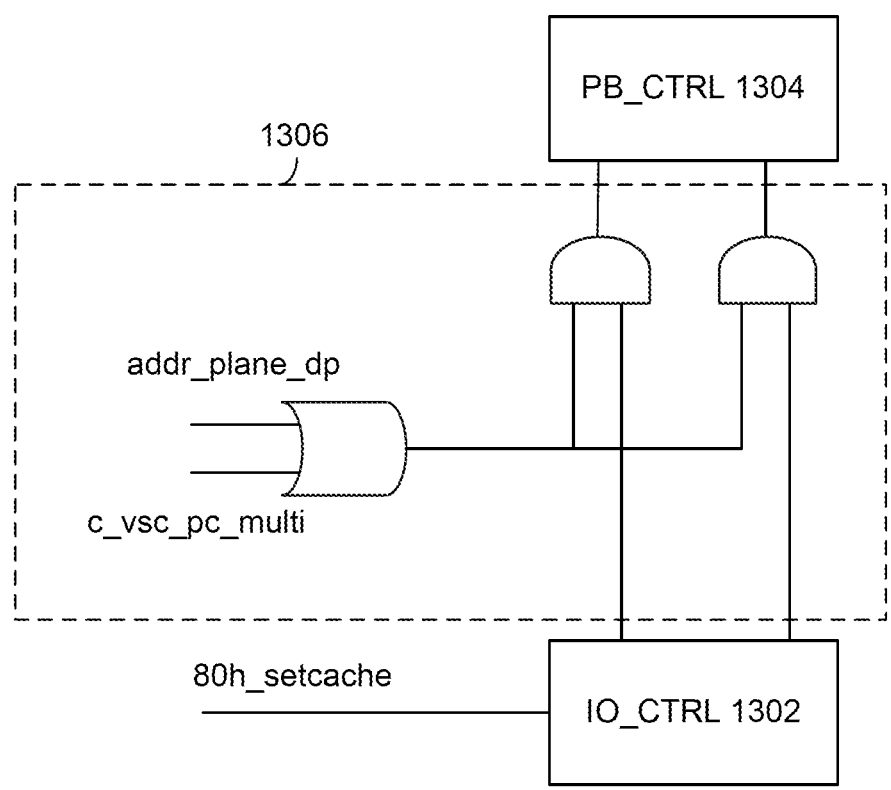
FIGS. 13A and 13B illustrate exemplary implementation block diagrams according to various aspects of the present disclosure.

FIG. 13A illustrates an exemplary implementation block diagram 1300 for a memory device consistent with the disclosed embodiments. The memory device may include a controller (not shown), e.g., the control circuit 222 with respect to FIG. 2. As shown in FIG. 13A, the implementation may include an input and output control circuitry IO_CTRL 1302, a page buffer control circuitry PB_CTRL 1304 for each plane, and a facility circuitry 1306. Other circuitry may also be included.

The IO_CTRL 1302 may be a single instance, while the PB_CTRL 1304 may be provided for each plane. The controller may transmit commands to the IO_CTRL 1304. The IO_CTRL 1302 may receive a "80*h*_setcache" signal from the commands, and may generate control signals or enable signals and transmit the control signals or enable signals to the PB_CTRL 1304. The PB_CTRL 1304 may include a reset circuitry for resetting the page registers based on the control signals from the IO_CTRL 1302. Further, the facility circuitry 1306 may provide a facility function between the IO_CTRL 1302 and PB_CTRL 1304.

Further, the input and output control circuitry IO_CTRL 1302 may be disposed in a data path of the memory device (e.g., the controller) and the facility circuitry 1306 may be disposed in a Y-path of the memory device. That is, the facility circuitry 1306 may be disposed in the Y-path circuit of the memory device, and the IO_CTROL 1302 may be in the data path circuit of the memory device.

Specifically, the facility circuitry 1306 may receive the address information sent from the controller or an address register (not shown), and may generate control signals or enable signals addr_plane_dp for individual planes and pass the control signals or enable signals addr_plane_dp to the reset circuitry of the PB_CTRL 1304. Thus, the control signals or enable signals addr_plane_dp from the facility circuitry 1306 for individual planes may be combined with the control signal/enable signal from the IO_CTRL 1302 by the reset circuitry to generate proper control signals/enable signals for all the individual planes. For example, the page register reset in the PB_CTRL 1304 of a specific plane according to the address information may be enabled by its corresponding addr_plane_dp signal, while the page register reset in the PB_CTRL 1304 of any other plane is not enabled by the corresponding addr_plane_dp signal. Thus, the page register reset may be performed only on one or more page registers of a selected plane according to the addr_plane_dp signal that is based on the address information.

Figure 13B:
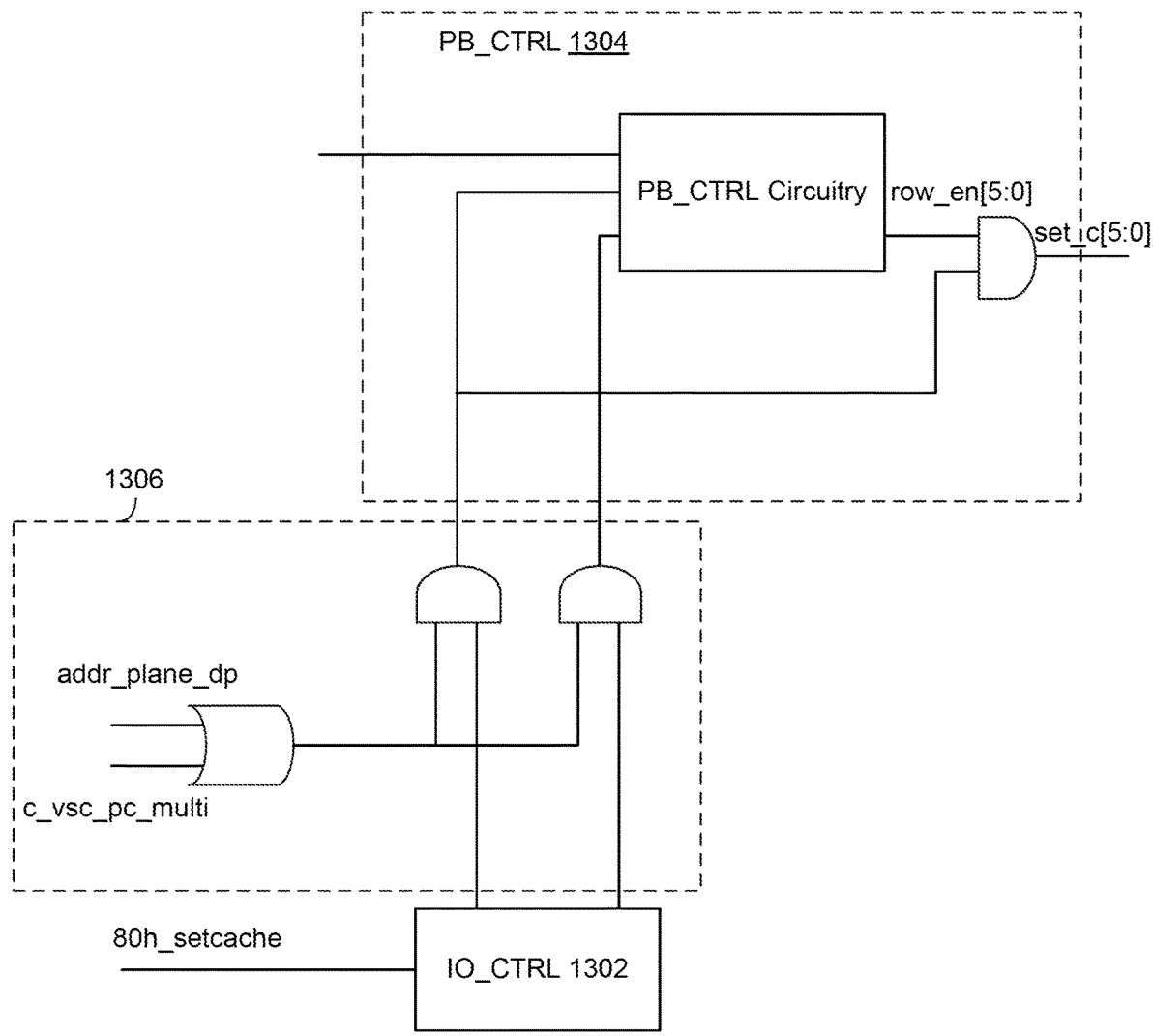

FIG. 13B illustrates the implementation block diagram 1300 shown in FIG. 13A with an example of a simplified reset circuitry in the PB_CTRL 1304. As shown in FIG. 13B, the enable signals (e.g., row_en[5:0]) for individual planes may be generated by the PB_CTRL circuitry to enable the individual planes for page register reset. At the same time, the enable signals are combined with the signal addr-_plane_dp to generate the final page register reset signal to only enable a specific plane according to the address information. The signal addr_plane_dp may use a bit map to enable/disable the enable signals row_en, or may use a single on/off signal to enable/disable the enable signals row_en.

For example, for a single plane of 16 KB and a configuration with 4 planes (4×16 KB), after six-byte address of page program command (80h) is received, the controller may only reset the page register of a single plane, which address is indicated by the address. Further, in the case of multi-plane page program, the controller will continue to only reset the page registers indicated by the six-byte address when executing command 80h or 81h. Thus, the peak power during page register reset of command 80h or 81h may be reduced, the total power consumption in the case of less than four plane programming may also be reduced, and/or the power noise that could affect background page register programming may also be reduced.

Further, the controller may send the facility circuitry 1306 a switch signal c_vsc_pc_multi for enabling or disabling the facilitation function of the facility circuitry 1306. The switch signal may also be referred as a "trim" bit signal and may control whether the control signals or enable signals for individual planes can be passed onto the PB_CTRL 1304 of the planes. The trim bit signal may be used by the controller to switch on/off the facility function and/or to keep backward compatibility with other page program standards.

For example, as shown in FIG. 13B, when the c_vsc_pc_multi is '0', the addr_plane_dp signal is not propagated to the PB_CTRL 1304 of the planes. In such case, only the control signal from IO_CTRL 1302 is propagated to the PB_CTRL 1304 of the planes. In the above example of four planes (4×16 KB), all page registers in the four planes (4×16 KB) may be reset even the page program command only applies to a single plane (16 KB). Other reset mechanisms may also be used.

Figure 14:
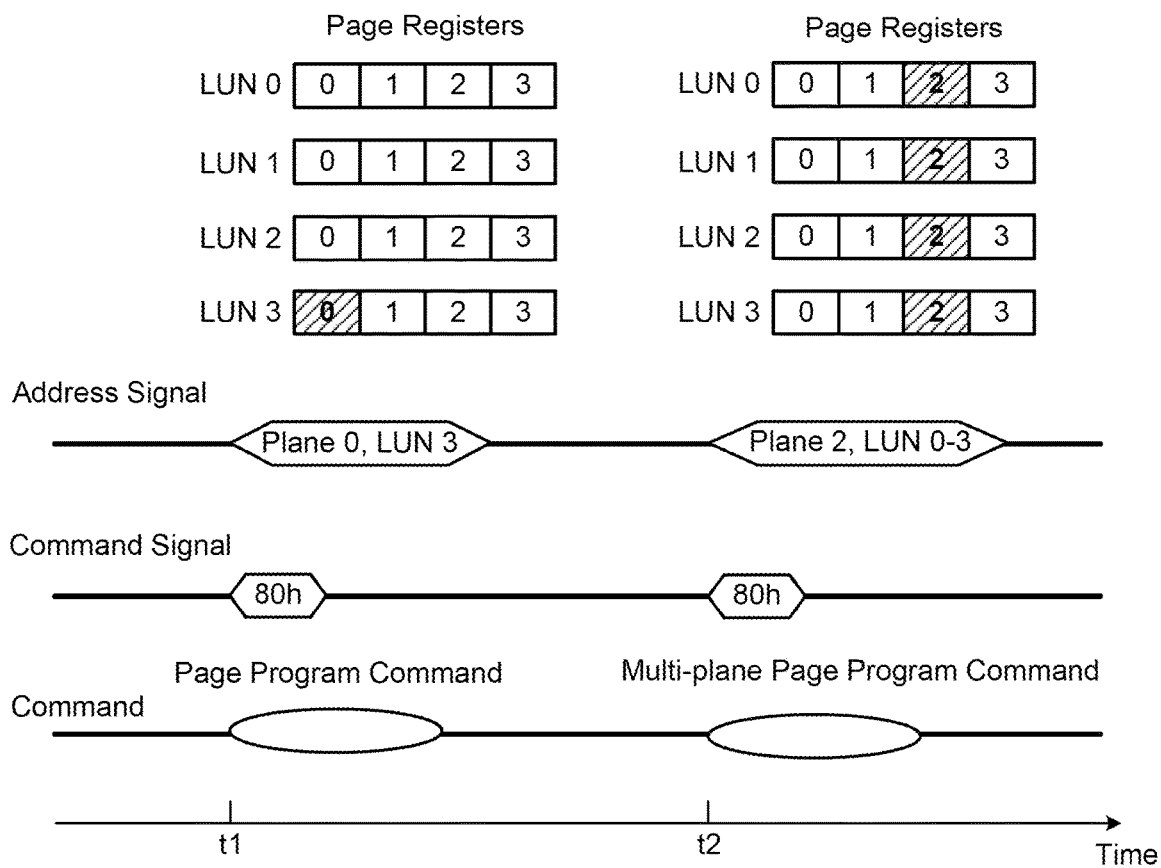
FIG. 14 illustrates a timing diagram of page register reset according to various aspects of the present disclosure.

FIG. 14 shows a timing diagram 1400 of page register reset of a 3D memory device according to various embodiments of the present disclosure. Assuming that the 3D memory device has a NAND target that contains four LUNs, e.g., LUN 0-LUN 3. Each LUN of the 3D memory device has four planes, e.g., plane 0-plane 3 that are connected to page register 0-page register 3, respectively.

At time t1, a controller of the 3D memory device receives command and address signals. The command received includes a page program command 80h. The address signals include, e.g., a 6-byte address. The controller detects that plane 0 of LUN 3 is indicated in the 6-byte address. After determining that plane 0 of LUN 3 is indicated in the address signals, the controller resets page register 0 of LUN 3 (i.e., the hatched page register of FIG. 14 before time t2) that corresponds to plane 0 of LUN 3. As such, the controller does not reset the remaining page registers of LUN 0-LUN 3 (i.e., all page registers of the NAND target except page register 0 of LUN 3) and keeps or maintains the status of the remaining page registers unchanged.

At time t2, the controller receives a multi-plane page program command 80h and address signals of the command. The controller detects that the address signals contain, e.g., a 6-byte address that indicates plane 2 for LUN 0-LUN 3. After determining that plane 2 and LUN 0-LUN 3 are indicated in the address signals, the controller resets page registers 2 of LUN 0-LUN 3 (i.e., the hatched page registers of FIG. 14 after time t2). The four reset page registers correspond to planes 2 of LUN 0-LUN 3, respectively. Hence, the controller does not reset the remaining page registers of LUN 0-LUN 3 (i.e., all page registers of the NAND target except page registers 2 of each LUN) and keeps or maintains the status of the remaining page registers unchanged.

Therefore, page program operations and multi-plane page program operations of a 3D memory device may be implemented with less power consumed according to embodiments of the present disclosure. At a page program operation, only the page register or page registers of the plane or planes of a NAND target that are indicated in a page program command are reset. At a multi-plane page program operation, only the page registers of the planes of a NAND target that are indicated in a multi-plane page program command are reset. At page program operations and multi-plane page program operations, page registers of planes of a NAND target that are not indicated in a command are not cleared unnecessarily and remain unchanged. Thus, compared to clearing all page registers of all LUNs of a NAND target or clearing all page registers of selected LUNs of a NAND target, less peak power and less total power may be consumed during a page register resetting process. Further, the power noise of the 3D memory device may be improved.

Although the principles and implementations of the present disclosure are described by using specific embodiments in the specification, the foregoing descriptions of the embodiments are only intended to help understand the present disclosure. In addition, features of aforementioned different embodiments may be combined to form additional embodiments. A person of ordinary skill in the art may make modifications to the specific implementations and application range according to the idea of the present disclosure. Hence, the content of the specification should not be construed as a limitation to the present disclosure.

What is claimed is:

1. A program method of a memory device having a plurality of planes, comprising:
   receiving a program command for the memory device;
   obtaining an address associated with the program command;
   determining a first plane of the plurality of planes according to the address; and resetting a page register of the first plane; and
   determining a second plane of the plurality of planes according to the address; and resetting a page register of the second plane when resetting the page register of the first plane, without resetting one or more page registers of one or more remaining planes of the plurality of planes.

2. The method according to claim 1, further comprising:
   maintaining status of the one or more page registers of the one or more remaining planes of the plurality of planes.

3. The method according to claim 1, wherein:
   the first plane and the second plane are from a same logical unit (LUN) of the memory device or from a plurality of LUNs of the memory device.

4. The method according to claim 1, wherein:
   resetting the page register of the first plane and resetting the page register of the second plane are performed within a same time period.

5. The method according to claim 1, wherein:
   the first plane is from a first logical unit (LUN) of the memory device, and one of the one or more remaining planes is from a second LUN of the memory device.

6. The method according to claim 1, wherein:
the first plane and one of the one or more remaining planes are from a same logical unit (LUN) of the memory device.

7. A memory device, comprising:
one or more logical units (LUNs) including a plurality of planes;
a plurality of page registers corresponding to the plurality of planes, respectively; and
a controller for executing commands, wherein the controller is configured to:
  receive a program command for the memory device;
  obtain an address associated with the program command;
  determine a first plane of the plurality of planes according to the address; and
reset one of the plurality of page registers corresponding to the first plane; and
  determine a second plane of the plurality of planes according to the address; and
reset another one of the plurality of page registers corresponding to the second plane when resetting the one of the plurality of page registers corresponding to the first plane, without resetting one or more remaining page registers of the plurality of page registers.

8. The memory device according to claim 7, wherein the controller is further configured to:
maintain status of the one or more remaining page registers of the plurality of page registers.

9. The memory device according to claim 7, wherein:
the first plane and the second plane are from a same LUN of the one or more LUNs or from different LUNs.

10. The memory device according to claim 7, wherein:
resetting the one of the plurality of page registers corresponding to the first plane and resetting the other one of the plurality of page registers corresponding to the second plane are performed within a same time period.

11. The memory device according to claim 7, further comprising:
a three-dimensional (3D) NAND memory device.

12. A memory device, comprising:
a plurality of planes; and
a reset circuit for resetting the plurality of planes, wherein the reset circuit is configured to: obtain a first control signal based on an address for reset of the plurality of planes; and reset a page register of a first plane of the plurality of planes according to the first control signal without resetting one or more page registers of one or more remaining planes of the plurality of planes;
a facility circuit configured to transmit the first control signal to the reset circuit based on the address; and
a controller configured to transmit the address to the facility circuit and transmit a switch signal to the facility circuit for controlling the reset.

13. The memory device according to claim 12, wherein the reset circuit is further configured to:
maintain status of the one or more page registers of the one or more remaining planes of the plurality of planes.

14. The memory device according to claim 12, further comprising:
an input/output (I/O) circuit configured to transmit a second control signal to the reset circuit after receiving a program command from the controller.

15. The memory device according to claim 12, wherein:
the facility circuit is disposed in a Y-path circuit of the memory device.

16. The memory device according to claim 12, wherein:
transmission of the first control signal from the facility circuit to the reset circuit is controlled by the switch signal.

* * * * *